(12) United States Patent
Kim et al.

(10) Patent No.: US 8,933,450 B2
(45) Date of Patent: Jan. 13, 2015

(54) ORGANIC ELECTRO-LUMINESCENT DISPLAY DEVICE

(75) Inventors: Jae-Bok Kim, Yongin (KR); Won-Jun Song, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 667 days.

(21) Appl. No.: 12/940,442

(22) Filed: Nov. 5, 2010

(65) Prior Publication Data

US 2011/0101359 A1    May 5, 2011

(30) Foreign Application Priority Data

Nov. 5, 2009    (KR) .................... 10-2009-0106649

(51) Int. Cl.
*H01L 51/52* (2006.01)
*H01L 27/32* (2006.01)
*H01L 51/00* (2006.01)

(52) U.S. Cl.
CPC ......... *H01L 27/3246* (2013.01); *H01L 51/0005* (2013.01)
USPC .................... 257/59; 257/52; 257/E51.018

(58) Field of Classification Search
CPC ....................................................... H01L 51/52
USPC .................................. 257/59, 52, E51.018
See application file for complete search history.

(56) References Cited

U.S. PATENT DOCUMENTS

| 2005/0046342 | A1* | 3/2005 | Park et al. ............... 313/504 |
| 2005/0118457 | A1 | 6/2005 | Morii |
| 2006/0061266 | A1 | 3/2006 | Kang et al. |
| 2006/0158107 | A1* | 7/2006 | Kai et al. ............... 313/504 |
| 2009/0243464 | A1* | 10/2009 | Yamazaki et al. ........ 313/498 |
| 2010/0084968 | A1* | 4/2010 | Watanabe et al. ....... 313/504 |
| 2010/0230669 | A1 | 9/2010 | Seo et al. |

FOREIGN PATENT DOCUMENTS

| JP | 2005-142055 A | 6/2005 |
| JP | 2006-004743 A | 1/2006 |
| KR | 10 2003-0064337 A | 7/2003 |
| KR | 10 2006-0026776 A | 3/2006 |
| KR | 10 2007-0037057 A | 4/2007 |

OTHER PUBLICATIONS

Korean Office Action in KR 10-2009-0106649, dated Aug. 25, 2011 (Kim, et al.).
Korean Office Action in KR 10-2009-0106649, dated May 1, 2012 (Kim, et al.).

* cited by examiner

*Primary Examiner* — Marc Armand
(74) *Attorney, Agent, or Firm* — Lee & Morse, P.C.

(57) ABSTRACT

An organic electro-luminescent display device includes a substrate, a pixel electrode on the substrate, and a pixel define layer covering edges of the pixel electrode and having an opening to expose the pixel electrode, a surface of the pixel define layer facing the opening being bent at a predetermined curvature.

20 Claims, 2 Drawing Sheets

ORGANIC ELECTRO-LUMINESCENT DISPLAY DEVICE

BACKGROUND

1. Field

Example embodiments relate to an organic electro-luminescent display device, and more particularly, to an organic electro-luminescent display device having improved uniformity of a thin film in a pixel area.

2. Description of the Related Art

In general, a flat display device may be classified as a non-emissive type or as an emissive type. An emissive type display device may include a flat cathode ray tube, a plasma display panel, an electro-luminescent device, and a light emitting diode display. A non-emissive type display device may include a liquid crystal display (LCD). For example, the electro-luminescent devices may have a wide viewing angle, excellent contrast, and high response speed. An electro luminescent device may be classified as an inorganic electro luminescent device or as an organic electro luminescent device based on a material used in forming an emission layer.

An organic electro luminescent device is a self-emissive display device that may emit light by electrically exciting a fluorescent organic compound and may be operated using a low voltage. In addition, an organic electro luminescent device may have a thin structure, a wide viewing angle, and a rapid response speed.

A conventional organic electro-luminescent device may include an emission layer formed of an organic material and interposed between an anode and a cathode. In the organic electro-luminescent device, when a positive voltage and a negative voltage are applied to the anode and the cathode, respectively, a hole injected from the anode is moved to the emission layer through a hole transport layer (HTL) and an electron is moved to the emission layer from the cathode through an electron transport layer (ETL). The hole and electron may combine in the emission layer to generate an exciton. As the excitons change from an excited state to a ground state, fluorescent elements in the emission layer emit light, and thus, an image may be formed. In a full-color type organic electro-luminescent device, pixels having three colors, e.g., red (R), green (G), and blue (B), may be included to realize full color.

In such an organic electro-luminescent device, a pixel define layer may be formed at both ends of the anode. When a predetermined opening is formed on the pixel define layer, the emission layer and the cathode may be sequentially formed on portions of the anode exposed to the outside through the opening.

SUMMARY

Embodiments are directed to an organic electro-luminescent display device, which substantially overcome one or more of the problems due to the limitations and disadvantages of the related art.

It is therefore a feature of an embodiment to provide an organic electro-luminescent display device having improved uniformity of a thin film in a pixel area.

At least one of the above and other features and advantages may be realized by providing an organic electro-luminescent display device, including a substrate, a pixel electrode formed on the substrate, and a pixel define layer for covering edges of the pixel electrode and having an opening to expose the pixel electrode, wherein, in cross-sections of the pixel electrode and the pixel define layer corresponding to a surface perpendicular to the pixel electrode, a surface of the pixel define layer contacting the opening is bent, having a predetermined curvature.

An angle between a contact line tangent to a point on the surface of the pixel define layer at the opening and the substrate may increase as the point is further distant from the substrate.

A first angle between a contact line tangent to a point on one end of the surface contacting the opening and the substrate may be different from a second angle between a contact line tangent to the other end of the surface contacting the opening and the substrate.

The sum total of a supplementary angle of the second angle and the first angle may be less than 180°.

The predetermined curvature may vary according to a distance from the substrate.

The predetermined curvature may gradually decrease as a distance from the pixel electrode decreases.

The surface of the pixel define layer facing the opening with respect to an upper surface of the pixel electrode inside the opening may be mild.

A cross section of the opening in a plane perpendicular to the substrate may have a shape of a quadratic curve with a projected lower part.

A majority of the surface of the pixel define layer facing the opening may not overlap the pixel electrode.

At least one of the above and other features and advantages may also be realized by providing an organic electro-luminescent display device, including a substrate, a pixel electrode formed on the substrate, and a pixel define layer for covering edges of the pixel electrode so as to expose a center part of the pixel electrode, wherein, in cross-sections of the pixel electrode and the pixel define layer corresponding to a surface perpendicular to the pixel electrode, an angle between a straight line tangent to a point on the pixel define layer and the substrate in the cross-section increases as the point is further distant from the edges of the pixel electrode.

The cross-section of the pixel define layer may be formed according to a quadratic curve in which the lower part thereof is projected.

At least one of the above and other features and advantages may be realized by providing an organic electro-luminescent, including at least one thin film transistor (TFT) formed on a substrate, the TFT including a semiconductor active layer, a gate electrode insulated from the semiconductor active layer, and source/drain electrodes contacting the semiconductor active layer, a plurality of pixel electrodes on the substrate, a pixel define layers formed between the pixel electrodes; a plurality of organic layers formed on the pixel electrodes, and opposite electrodes formed on the organic layers, wherein, in cross-sections of the pixel electrode and the pixel define layer corresponding to a surface perpendicular to the pixel electrode, a first angle between a contact line tangent to one end of the pixel define layer and the substrate is different from a second angle between a contact line tangent to the other end of the pixel define layer and the substrate.

The sum total of a supplementary angle of the second angle and the first angle may be less than 180°.

The cross-section of the pixel define layer may be formed according to a quadratic curve in which the lower part thereof is projected.

The opposite electrodes may be formed along the pixel define layer on the pixel define layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
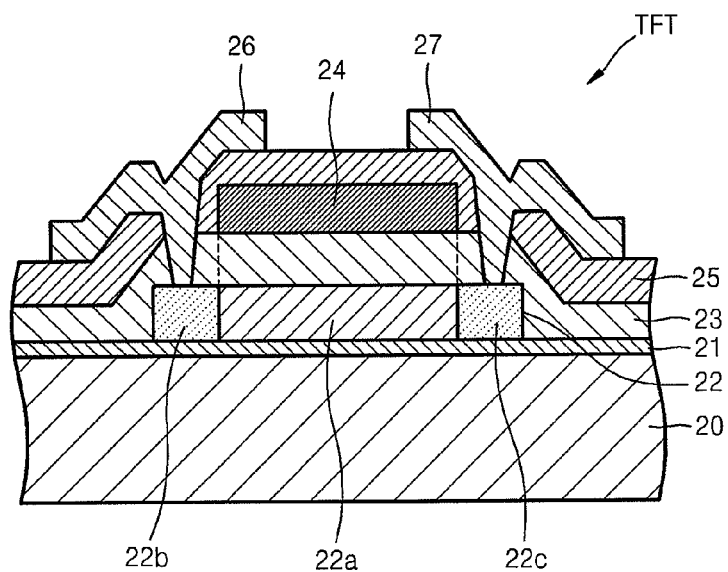
FIG. 1 illustrates a cross-sectional view of a thin film transistor (TFT) according to an embodiment.

Korean Patent Application No. 10-2009-0106649, filed on Nov. 5, 2009, in the Korean Intellectual Property Office, and entitled: "Organic Electro-Luminescent Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, one or more embodiments will be described more fully with reference to the accompanying drawings.

FIG. 1 illustrates a cross-sectional view of a thin film transistor (TFT) according to an embodiment. Referring to FIG. 1, the TFT may be formed on a substrate 20. The substrate 20 may be, e.g., a glass substrate or a plastic substrate.

As further illustrated in FIG. 1, a buffer layer 21 may be formed on the substrate 20, an active layer 22, e.g., formed of a semiconductor material, may be formed on the buffer layer 21, and a gate insulating layer 23 may be formed to cover the active layer 22. A gate electrode 24 may be formed on the gate insulating layer 23, an interlayer insulating layer 25 may be formed to cover the gate electrode 24, and source/drain electrodes 26 and 27 may be formed on the interlayer insulating layer 25. The source/drain electrodes 26 and 27 may contact source/drain areas 22b and 22c of the active layer 22, respectively, through contact holes formed in the gate insulating layer 23 and the interlayer insulating layer 25.

The active layer 22 may be formed of an inorganic semiconductor material or an organic semiconductor material on the substrate 20. An n-type impurity or a p-type impurity may be doped into the source/drain areas 22b and 22c. A channel area 22a connecting the source/drain areas 22b and 22c may be included in the active layer 22.

Examples of an inorganic semiconductor material for forming the active layer 22 may include one or more of CdS, GaS, ZnS, CdSe, CaSe, ZnSe, CdTe, SiC, and Si. Examples of an organic semiconductor material for forming the active layer 22 may include a polymer including polythiophene or derivatives thereof, poly para-phenylene vinylene and derivatives thereof, poly-praraphenylene or derivatives thereof, polyfluorenes or derivatives thereof, polythiophene vinylene or derivatives thereof, and polythiophene-heterocyclic aromatic copolymer or derivatives thereof. Further, examples of an organic semiconductor material for forming the active layer 22 may include low molecular weight material, e.g., one or more of pentacene, tetracene, oligoacene of naphthalene, or derivatives thereof, alpha-6-thiophen, oligothiophene of alpha-5-thiophen or derivatives thereof, phthalocyanine with a metal or without a metal or derivatives thereof, pyromellitic dianhydride or pyromellitic diimide or derivatives thereof, or perylenetetracarboxylic acid dianhydride or perylenetetracarboxylic diimide or derivatives thereof.

The active layer 22 may be covered by the gate insulating layer 23, and the gate electrode 24 may be formed on the gate insulating layer 23. The gate electrode 24 may be formed of a conductive metal film, e.g., one or more of MoW, Al, Cr, and Al/Cu but is not limited thereto. For example, the gate electrode 24 may be formed of various conductive materials, e.g., a conductive polymer. The gate electrode 24 may be formed to cover an area corresponding to the channel area 22a of the active layer 22.

Figure 2:
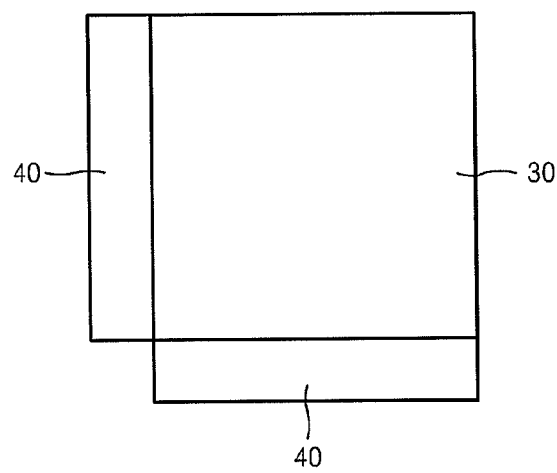
FIG. 2 illustrates a schematic plan view of an organic electro-luminescent display device according to an embodiment.

FIG. 2 illustrates a plan view of an organic electro-luminescent display device according to an embodiment. Referring to FIG. 2, the organic electro-luminescent display device according to an embodiment may include a pixel area 30 and a circuit area 40 disposed at edges of the pixel area 30. The pixel area 30 may include a plurality of pixels, each of which includes an emitting unit for emitting light in order to realize predetermined images.

According to an embodiment, the emitting unit in each pixel may include a plurality of sub-pixels, each of which includes an organic electro-luminescent device, e.g., an organic light emitting diode (OLED). In a full-color organic electro-luminescent display device, the pixels may be formed by arranging the sub-pixels, e.g., R, G, and B sub-pixels, into various patterns in the form of a line, a mosaic, or a lattice. Also, a mono-color flat display device may be realized instead of a full-color flat display device.

The circuit area 40 controls image signals input to the pixel area 30. In such an organic electro-luminescent display device, at least one TFT may be included in each of the pixel area 30 and the circuit area 40.

The TFTs included in the pixel area 30 may include pixel unit TFTs including TFTs for switching and TFTs for operating. The TFTs for switching transmit data signals to respective light emitting devices according to signals through gate lines to control operation of the pixel area 30. The TFTs for operating are operated to supply a predetermined current through an organic electro-luminescent display device according to a data signal. In addition, the TFTs included in the circuit area 40 may include circuit unit TFTs for realizing a predetermined circuit.

The number and arrangement of the TFTs in the organic electro-luminescent display device may vary according to a characteristic and an operating method of the display device. An arrangement method thereof may also vary.

Figure 3:
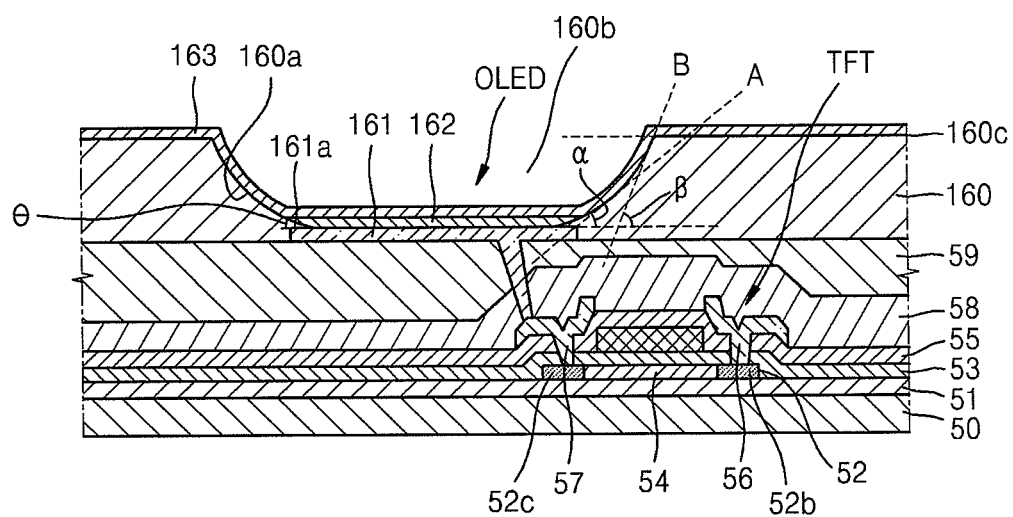
FIG. 3 illustrates a cross-sectional view of one sub-pixel included in the organic electro-luminescent display device of FIG. 2.

FIG. 3 illustrates a cross-sectional view of one sub-pixel included in the organic electro-luminescent display device of FIG. 2. Referring to FIG. 3, a buffer layer 51 may be formed on a substrate 50 formed of glass or plastic, and a TFT and an organic electro luminescent diode (OLED) may be sequentially formed on the buffer layer 51. The TFT on the substrate 50 may have a substantially same structure as described previously with reference to FIG. 1.

As illustrated in FIG. 3, an active layer 52 having a predetermined pattern may be formed on the buffer layer 51, i.e., which may be formed on the substrate 50. A gate insulating layer 53 may be formed on the active layer 52, and a gate electrode 54 may be formed on a predetermined area of the gate insulating layer 53. The gate electrode 54 may be connected to a gate line (not illustrated) that applies TFT on/off signals. An interlayer insulating layer 55 may be formed on the gate electrode 54, and source/drain electrodes 56 and 57 may be formed to contact source/drain areas 52*b* and 52*c* of the active layer 52, respectively, through contact holes in the gate insulating layer 53 and the interlayer insulating layer 55. A passivation layer 58, e.g., formed of $SiO_2$ or $SiN_x$, may be formed on the source/drain electrodes 56 and 57, and a planarization film 59, e.g., formed of an organic material such as acryl, polyimide, or benzocyclobutene (BCB), may be formed on the passivation layer 58.

As further illustrated in FIG. 3, a pixel electrode 161, e.g., an anode of the OLED, may be formed on the planarization film 59, and a pixel define layer 160, e.g., formed of an organic material, may be formed to cover the pixel electrode 161. An opening 160*b* may be formed in the pixel define layer 160, e.g., a portion of the pixel define layer 160 may be removed to expose an upper surface 161*a* of the pixel electrode 161, so an organic layer 162 may be formed on the pixel define layer 160 and on the exposed upper surface 161*a* of the pixel electrode 161 exposed by the opening 160*b*. For example, the organic layer 162 may include an emission layer. Embodiments are not limited thereto, and structures of any of various organic electro-luminescent display devices may be applied.

In the organic electro-luminescent display device according to an embodiment, the pixel define layer 160 may have a predetermined curvature. That is, portions of a surface 160*a* of the pixel define layer 160 that defines and faces the opening 160*b* therein, i.e., portions of a surface defined by removing a portion of the pixel define layer to expose the pixel electrode 161, may be curved. The structure, function, and effect of the curved pixel define layer 160 will be described in more detail below.

The OLED may emit red, green, or blue light according to flow of current and, thus, may display predetermined image information. The OLED may include the pixel electrode 161, an opposite electrode 163, and the organic layer 162 interposed between the pixel electrode 161 and the opposite electrode 163. The pixel electrode 161 may be connected to the drain electrode 57 of the TFT, and may receive positive voltage supply from the drain electrode 57. The opposite electrode 163 may cover the entire pixel, and may supply negative voltage supply.

The pixel electrode 161 and the opposite electrode 163 may be insulated from each other by the organic layer 162, and voltages having opposite polarities may be applied to the pixel electrode 161 and the opposite electrode 163 so as to emit light.

The organic layer 162 may include a low molecular weight organic material or a polymer. When a low molecular weight material is used as the organic layer 162, a hole injection layer (HIL), a hole transport layer (HTL), an emitting layer (EML), an electron transport layer (ETL), and an electron injection layer (EIL) may be stacked upon one another as a single structure or as a complex structure stacked on the pixel electrode 161. Examples of the low molecular weight organic material may include copper phthalocyanine (CuPc), N,N'-Di(naphthalene-1-yl)-N,N'-diphenyl-benzidine (NPB), tris-8-hydroxyquinoline aluminum (Alq3), or the like. The low molecular weight organic material may be formed using vacuum deposition.

When the organic layer 162 includes a polymer, the organic layer 162 may have a structure including a HTL and an EML. For example, the HTL may be formed of PEDOT, and the EML may be formed of a polymer organic material, e.g., poly-phenylenevinylene (PPV), polyfluorene, or the like. The polymer organic layer may be formed via screen printing or inkjet printing. However, the organic layer 162 is not limited thereto and various embodiments may be applied.

The pixel electrode 161 may function as an anode, and the opposite electrode 163 may function as a cathode. It is noted, however, that the functions of the pixel and opposite electrodes 161 and 163 may be reversed.

The pixel electrode 161 may be a transparent electrode or a reflective electrode. The pixel electrode 161 as a transparent electrode may be formed of, e.g., indium-doped tin oxide (ITO), indium zinc oxide (IZO), zinc oxide, or indium oxide ($In_2O_3$). The pixel electrode 161 as a reflective electrode may be formed by forming a reflective film using, e.g., silver (Ag), magnesium (Mg), aluminum (Al), platinum (Pt), palladium (Pd), gold (Au), nickel (Ni), mendelevium (Md), iridium (Ir), chromium (Cr), or a compound thereof, and then forming ITO, IZO, ZnO, or $In_2O_3$ on the reflective film.

The opposite electrode 163 may be a transparent electrode or a reflective electrode. When the opposite electrode 163 is a transparent electrode, the opposite electrode 163 may be used as a cathode and, thus, may be formed by depositing a metal having a small work function, e.g., lithium (Li), calcium (Ca), LiF/Ca, LiF/Al, Al, Ag, Mg, or a compound thereof, to face the organic layer 162, followed by forming an auxiliary electrode layer or a bus electrode line using a material for forming a transparent electrode, e.g., ITO, IZO, ZnO, or $In_2O_3$. When the opposite electrode 163 is a reflective electrode, the opposite electrode 163 may be formed by depositing, e.g., Li, Ca, LiF/Ca, LiF/Al, Al, Ag, Mg, or a compound thereof on the organic layer 162.

Hereinafter, the pixel define layer 160 of the organic electro-luminescent display device according to an embodiment will be described. The pixel define layer 160 denotes a patterned insulating layer that accurately defines a pixel area during manufacturing of the organic electro-luminescent display device.

As illustrated in FIG. 3, the upper surface 160*a* of the pixel define layer 160, i.e., a surface that defines and contacts the opening 160*b* of the pixel define layer 160, may be non-linear. In particular, the upper surface 160*a* may be bent to have a predetermined curvature. That is, the pixel define layer 160 may be formed such that an angle between a tangent to a point on the pixel define layer 160 and the substrate 50 may increase, as a distance between the tangent point and the substrate 50 increases. In other words, the cross-section of the pixel define layer 160 in a plane perpendicular to the substrate 50 may be formed according to a quadratic curve in which the lower part thereof is projected, e.g., may have an approximate shape of a positive parabola with a wide bottom part. It is noted that the angle between the substrate 50 and the tangent to the pixel define layer 160 is measured as an angle between the tangent and an extension of the pixel electrode 161, as illustrated by exemplary angles α and β in FIG. 3, so that the angle between the tangent to the pixel define layer 160 and the substrate 50 may be an acute angle.

In detail, the opening 160*b* in the pixel define layer 160 may be defined by curved surfaces 160*a*, e.g., having a center above a linear surface 160*c* of the pixel define layer 160, so the curvature of the surfaces 160*a* may gradually decrease to smoothly merge with the upper surface 161*a* of the pixel electrode 161, i.e., an incline of the surface 160*a* of the pixel define layer 160 facing the opening 160*b* with respect to the surface 161*a* of the pixel electrode 161 inside the opening 160*b* may be mild. That is, as illustrated in FIG. 3, an angle θ between the upper surface 161*a* of the pixel electrode 161 outside the opening 160*b* and the surface 160*a* of the pixel define electrode 160 at a region immediately adjacent to a contact point therebetween may be very small, e.g., negligible.

For example, the curvature of the surface 160*a* may change, so a first angle α between a tangent at one point of the surface 160*a* of the pixel define layer 160 and the substrate 50 may be different from, e.g., smaller than, a second angle β between a tangent to the other point on the surface 160*a* of the pixel define layer 160 and the substrate 50. Thus, an angle between a tangent to a point adjacent to the opening 160*b* on the pixel define layer 160 and the substrate 50 may increase, as a distance from the point to the substrate 50 increases. It is noted that a sum of a supplementary angle (180−β) of the second angle β and the first angle α is less than 180°. In particular, as illustrated in FIG. 3, the supplementary angle (180−β) of the second angle β and the first angle α correspond to two inside angles of a triangle. As a sum of three inside angles of a triangle is 180°, the sum of two inside angles of a triangle, i.e., the first angle α and the supplementary angle (180−β) of the second angle β, is less than 180°.

When a side of the pixel define layer 160 is curved, i.e., includes curved surfaces 160*a* according to example embodiments, a low inclined angle may be maintained at one end of the organic layer 162 in the pixel define layer 160, i.e., due to the small angle θ. In other words, during formation of the organic layer 162 on the pixel electrode 161 and on a portion of the surface 160*a* of the pixel define layer 160, projection of the organic layer 162 on the surface 160*a* due to surface tension may be substantially reduced due to the small angle. In addition, as the pixel define layer 160 is bent, back flow may be reduced when forming a thin film, e.g., the organic layer 162, by using a forced flow, e.g., spin coating or slit coating, so uniformity of the organic layer 162 may be maintained across pixels.

In contrast, a conventional pixel define layer may not be curved, i.e., may include an opening defined by straight surfaces inclined at a constant angle with respect to a substrate, e.g., in order to remove a shadow effect during a depositing process. In this case, when the organic layer is formed by depositing a solution, followed by solvent evaporation, e.g., by spinning a substrate after coating the substrate with a solution, to form a thin film, the solvent of the organic layer may move along the straight surfaces of the opening of the pixel define layer due to surface tension before evaporating to form a meniscus. As such, a resultant organic layer, e.g., having a thickness of a few tens of nm, may have a concave shape with edges projecting sharply along the straight surfaces of the pixel define layer, e.g., having a thickness of hundreds to thousands of nm, and thereby reducing uniformity of the organic layer. Further, during formation of the organic layer on the conventional pixel define layer, when the solvent is forcibly evaporated by spinning, e.g., spin coating, the pixel define layer may generate back flow of the solvent, thereby reducing uniformity of the organic layer. Moreover, since the uniformity may be hard to control, a process variation may increase. Thus, an emission surface may not be uniform when manufacturing the conventional organic electro luminescent device.

Accordingly, the organic electro-luminescent display device according to embodiments may include a bent pixel define layer 160 with a predetermined curvature. As such, an inclined angle of the surface 160*a* of the pixel define layer 160 may be reduced and accordingly, a thickness of the pixel define layer 160 may be reduced. Thus, it may be possible to prevent or substantially minimize projection of both ends of the organic layer 162 from projecting along the pixel define layer 160 due to surface tension. Therefore, uniformity of a thin film, i.e., organic layer 162, may be improved in a pixel area.

It is further noted that in consideration of interference with neighboring pixels, reduction in the thickness of the pixel define layer 160 may be limited, i.e., there may be a limit to reducing the inclined angle, in order to avoid adverse effects on high-resolution. Also, in forming a thin film by using forced circulation, e.g., spin coating, or a forced flow, e.g., slit coating, sidewalls of the pixel define layer 160 may be large. Accordingly, edges of the organic layer 62 may be thicker to avoid back flow.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic electro-luminescent display device, comprising:
    a substrate;
    a pixel electrode on the substrate;
    a pixel define layer covering edges of the pixel electrode and having an opening to expose the pixel electrode, a surface of the pixel define layer facing the opening being bent at a predetermined curvature, such that entire sidewalls of the pixel define layer defining the opening are curved and define a vertex with an upper surface of the pixel define layer; and
    an organic layer on the pixel electrode, the organic layer only partially overlapping the bent surface of the pixel define layer.

2. The device as claimed in claim 1, wherein an angle between the substrate and a tangent to a point on the surface of the pixel define layer facing the opening increases, as a distance between the point and the substrate increases.

3. The device as claimed in claim 1, wherein a first angle between the substrate and a tangent to a point on a bottom of the surface facing the opening is different from a second angle between the substrate and a tangent to a point on a top of the surface facing the opening.

4. The device as claimed in claim 1, wherein the predetermined curvature continuously varies along the entire bent surface according to a distance from the substrate.

5. The device as claimed in claim 1, wherein the predetermined curvature gradually decreases as a distance from the pixel electrode decreases.

6. The device as claimed in claim 1, wherein a cross section of the opening in a plane perpendicular to the substrate has a shape of a quadratic curve with a projected lower part.

7. The device as claimed in claim 1, wherein a majority of the surface of the pixel define layer facing the opening does not overlap the pixel electrode.

8. The device as claimed in claim 1, wherein the entire surface of the pixel define layer facing the opening is curved.

9. The device as claimed in claim 1, wherein a majority of a length of the organic layer contacts only the pixel electrode among the pixel electrode and the pixel define layer.

10. The device as claimed in claim 1, wherein a contact point between a surface of the pixel define layer contacting the opening and a surface of the pixel define layer parallel to the substrate forms a sharp point.

11. The device as claimed in claim 3, wherein a sum of the first angle and a supplementary angle of the second angle is less than 180°.

12. The device as claimed in claim 5, wherein an incline of the surface of the pixel define layer facing the opening with respect to an upper surface of the pixel electrode inside the opening is mild.

13. The device as claimed in claim 8, wherein the entire surface of the pixel define layer facing the opening is concave.

14. The device as claimed in claim 8, wherein a center of curvature of each portion of the curved surface is above an upper linear surface of the pixel define layer.

15. An organic electro-luminescent display device, comprising:
   a substrate;
   a pixel electrode on the substrate;
   a pixel define layer on the pixel electrode and exposing a center of the pixel electrode, an angle between the substrate and a tangent to a point on the pixel define layer continuously increasing from a lower surface of the pixel define layer to an upper surface of the pixel define layer, as a distance between the point and edges of the pixel electrode increases; and
   an organic layer on the pixel electrode, the organic layer only partially overlapping the curved surface of the pixel define layer.

16. The device as claimed in claim 15, wherein a cross-section of the pixel define layer has a shape of a quadratic curve with a projected lower part.

17. An organic electro-luminescent display device, comprising:
   at least one thin film transistor (TFT) on a substrate, the TFT including a semiconductor active layer, a gate electrode insulated from the semiconductor active layer, and source/drain electrodes contacting the semiconductor active layer;
   a plurality of pixel electrodes on the substrate;
   a pixel define layer between the pixel electrodes, a first angle between the substrate and a tangent to one end of the pixel define layer being different from a second angle between the substrate and a tangent to another end of the pixel define layer, both tangents defining the first and second angles being within the pixel define layer;
   a plurality of organic layers on the pixel electrodes, each of the organic layers only partially overlapping the curved surface of a corresponding pixel define layer; and
   opposite electrodes on the organic layers.

18. The device as claimed in claim 17, wherein a sum of the first angle and a supplementary angle of the second angle is less than 180°.

19. The device as claimed in claim 17, wherein a cross-section of the pixel define layer has a shape of a quadratic curve with a projected lower part.

20. The device as claimed in claim 17, wherein the opposite electrodes are formed along the pixel define layer on the pixel define layer.

* * * * *